(12) United States Patent
Wang et al.

(10) Patent No.: US 11,955,405 B2
(45) Date of Patent: Apr. 9, 2024

(54) SEMICONDUCTOR PACKAGE INCLUDING THERMAL INTERFACE STRUCTURES AND METHODS OF FORMING THE SAME

(71) Applicant: Taiwan Semiconductor Manufacturing Company Limited, Hsinchu (TW)

(72) Inventors: Jen Yu Wang, Hsinchu (TW); Chung-Jung Wu, Hsinchu (TW); Sheng-Tsung Hsiao, Hsinchu (TW); Tung-Liang Shao, Hsinchu (TW); Chih-Hang Tung, Hsinchu (TW); Chen-Hua Yu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 165 days.

(21) Appl. No.: 17/577,069

(22) Filed: Jan. 17, 2022

(65) Prior Publication Data

US 2023/0007912 A1   Jan. 12, 2023

Related U.S. Application Data

(60) Provisional application No. 63/219,843, filed on Jul. 9, 2021.

(51) Int. Cl.
*H01L 23/373* (2006.01)
*H01L 23/473* (2006.01)

(52) U.S. Cl.
CPC ........ *H01L 23/3736* (2013.01); *H01L 23/473* (2013.01)

(58) Field of Classification Search
CPC .................. H01L 23/3736; H01L 23/473
See application file for complete search history.

(56) References Cited

U.S. PATENT DOCUMENTS

| | | | |
|---|---|---|---|
| 2014/0252585 A1* | 9/2014 | Chen | H01L 33/648 |
| | | | 257/692 |
| 2015/0262972 A1* | 9/2015 | Katkar | H01L 22/32 |
| | | | 438/107 |
| 2019/0385929 A1* | 12/2019 | Ku | H01L 25/0655 |
| 2020/0006181 A1* | 1/2020 | Chen | H01L 24/29 |
| 2022/0013475 A1* | 1/2022 | Kim | H01L 23/16 |

* cited by examiner

*Primary Examiner* — Peniel M Gumedzoe
(74) *Attorney, Agent, or Firm* — The Marbury Law Group, PLLC (57) ABSTRACT

A semiconductor package includes a package substrate; semiconductor devices disposed on the package substrate; a package ring disposed on a perimeter of the package substrate surrounding the semiconductor devices; a cover including silicon bonded to the package ring and covering the semiconductor devices; and a thermal interface structure (TIS) thermally connecting the semiconductor devices to the cover.

20 Claims, 7 Drawing Sheets

SEMICONDUCTOR PACKAGE INCLUDING THERMAL INTERFACE STRUCTURES AND METHODS OF FORMING THE SAME

RELATED APPLICATIONS

This application claims priority to U.S. Provisional Patent Application No. 63/219,843 entitled "A Thermal Interface Scheme for High Performance Computing Application" filed on Jul. 9, 2021, the entire contents of which are hereby incorporated by reference for all purposes.

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these 3D devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A semiconductor package may include multiple semiconductor dies arranged on a package substrate and below a metal cover. Conventionally, a high thermal conductivity solder may be applied to transfer heat from the multiple semiconductor dies to the metal cover. However, such a structure may experience high amounts of thermal-mechanical stress, which may result in the formation of cracks in the silicon dies. As a result, conventional package structures utilize additional backside metallization, in an effort to reduce such silicon cracking. Accordingly, various embodiments are disclosed herein to provide semiconductor packages that include thermal interface structures configured to reduce the amount of thermal-mechanical stress applied to the semiconductor packages, without the need for such additional backside metallization.

Figure 1:
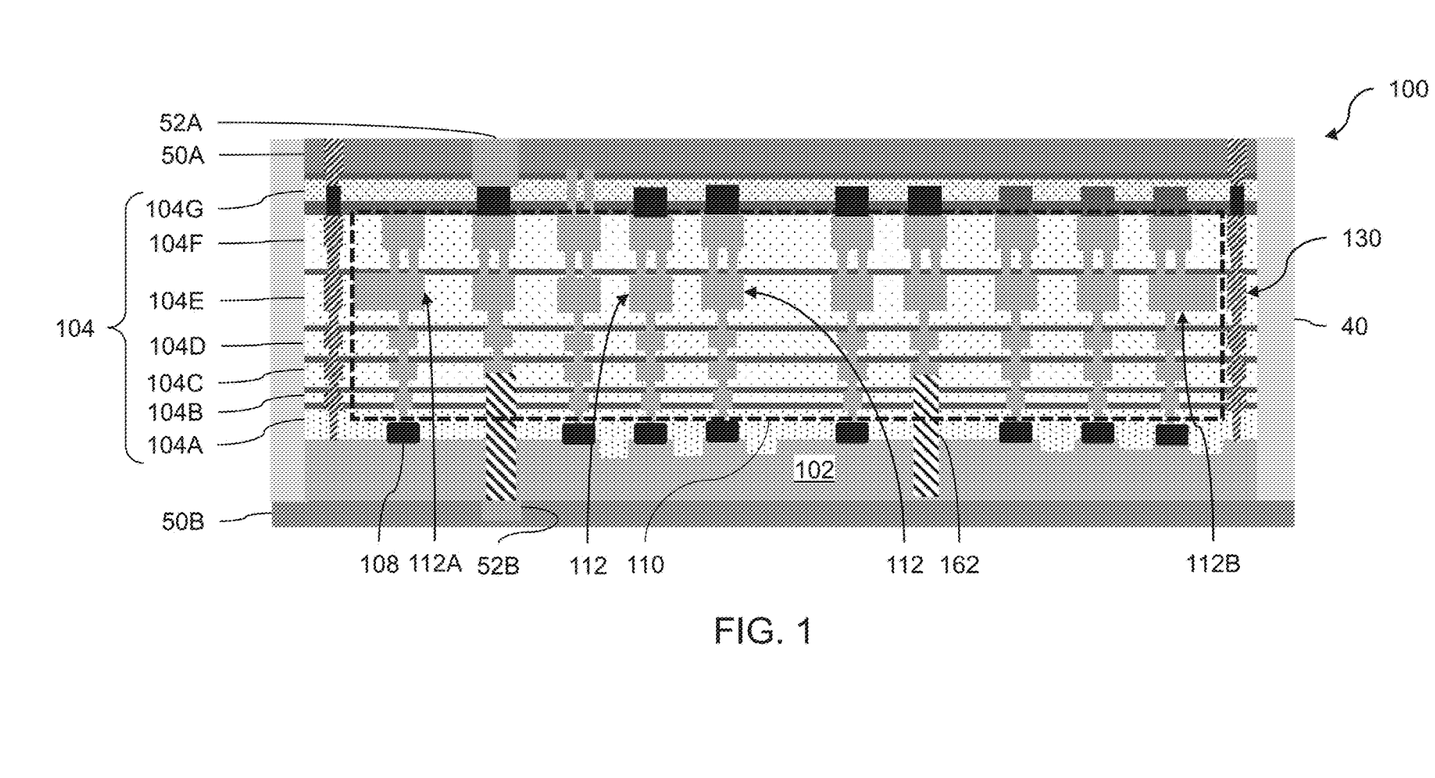
FIG. 1 is a vertical cross-sectional view of a semiconductor die 100, according to various embodiments of the present disclosure.

FIG. 1 is a cross-sectional view of a die 100, according to various embodiments of the present disclosure. Referring to FIG. 1, the die 100 may be, for example, an application-specific integrated circuit (ASIC) chip, an analog chip, a sensor chip, a wireless and radio frequency chip, a voltage regulator chip or a memory chip. In some embodiments, the die 100 may be an active component or a passive component. In some embodiments, the die 100 includes a planar semiconductor substrate 102, a dielectric structure 104, an interconnect structure 110 embedded within the dielectric structure 104, a seal ring 130, and a TSV structure 162.

In some embodiments, the semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the semiconductor substrate 102 may be a semiconductor-on-insulator (SOI) substrate. In various embodiments, the semiconductor substrate 102 may take the form of a planar substrate, a substrate with multiple fins, nanowires, or other forms known to people having ordinary skill in the art. Depending on the requirements of design, the semiconductor substrate 102 may be a P-type substrate or an N-type substrate and may have doped regions therein. The doped regions may be configured for an N-type device or a P-type device.

In some embodiments, the semiconductor substrate 102 includes isolation structures defining at least one active area, and a device layer may be disposed on/in the active area. The device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the device layer includes a gate structure, source/drain regions, spacers, and the like.

The dielectric structure 104 may be disposed on a front side of the semiconductor substrate 102. In some embodiments, the dielectric structure 104 may include silicon oxide, silicon oxynitride, silicon nitride, a low dielectric constant (low-k) material, or a combination thereof. Other suitable dielectric materials may be within the contemplated scope of disclosure. The dielectric structure 104 may be a single layer or a multiple-layer dielectric structure. For example, as shown in FIG. 1B, the dielectric structure 104 may include multiple dielectric layers 104A-104F, which may include a substrate oxide layer 104A, inter-layer dielectric (ILD) layers 104B-104F, and a passivation layer 104G. However, while FIG. 1 illustrates seven dielectric layers, the various embodiments of the present disclosure are not limited to any particular number of layers.

The dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

An interconnect structure 110 may be formed in the dielectric structure 104. The interconnect structure 110 may include metal features 112 disposed in the dielectric structure 104. The metal features 112 may be any of a variety metal lines and via structures that electrically connect the metal lines of adjacent ILD layers 104B-104F. The metal features 112 may include a connection line 112A that may be used in a die-to-die connection circuit, as discussed in detail below. The metal features 112 may optionally include a second connection line 112B that may be used in a die-to-die connection circuit, as also discussed below.

The interconnect structure 110 may be electrically connected to substrate electrodes 108 disposed on the semiconductor substrate 102, such that the interconnect structure 110 may electrically interconnect connect semiconductor devices formed on the semiconductor substrate 102. In some embodiments, the substrate electrodes 108 may include metal gates of transistors formed in the device layer of the semiconductor substrate 102.

The interconnect structure 110 may be formed of any suitable electrically conductive material, such as copper (Cu), a copper alloy, aluminum (Al), an aluminum alloy, silver (Ag), combinations thereof, or the like. For example, the interconnect structure 110 may be preferably include copper at an atomic percentage greater than 80%, such as greater than 90% and/or greater than 95%, although greater or lesser percentages of copper may be used.

In some embodiments, barrier layers (not shown) may be disposed between the metal features 112 and the dielectric layers of dielectric structure 104, to prevent the material of the metal features 112 from migrating to the semiconductor substrate 102. The barrier layer may include Ta, TaN, Ti, TiN, CoW, or combinations thereof, for example. Other suitable barrier layer materials may be within the contemplated scope of disclosure.

The seal ring 130 may extend around the periphery of the die 100. In other words, the seal ring 130 may be disposed adjacent to side surfaces of the die 100. For example, the seal ring 130 may be disposed in the dielectric structure 104 and may laterally surround the interconnect structure 110. The seal ring 130 may be configured to protect the interconnect structure 110 from contaminant diffusion and/or physical damage during device processing, such as plasma etching and/or deposition processes.

The seal ring 130 may include copper at an atomic percentage greater than 80%, such as greater than 90% and/or greater than 95% although greater or lesser percentages may be used. The seal ring 130 may include conductive lines and via structures that are connected to each other, and may be formed simultaneously with the conductive lines 112L and via structures 112V of the metal features 112 of the interconnect structure 110. The seal ring 130 may be electrically isolated from the metal features 112.

In some embodiments, the metal features 112 and/or the seal ring 130 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the metal features 112 and/or the seal ring 130 may be formed by an electroplating process.

For example, the Damascene processes may include patterning the dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the dielectric structure 104.

In particular, the patterning, metal deposition, and planarizing processes may be performed for each of the ILD layers 104B-104F, in order to form the interconnect structure 110 and/or the seal ring 130. For example, ILD layer 104B may be deposited and patterned to form openings. A deposition process may then be performed to fill the openings in the ILD layer 104B. A planarization process may then be performed to remove the overburden and form metal features 112 in the ILD layer 104B. These process steps may be repeated to form the ILD layers 104C-104F and the corresponding metal features 112, and thereby complete the interconnect structure 110 and/or seal ring 130.

A front side bonding layer 50A may be disposed over the dielectric structure 104. The front side bonding layer 50A may be formed of a dielectric bonding material such as an epoxy resin or an inorganic material, such as an inorganic oxide material for interconnection with an adjacent metal layer. A front side bonding pad 52A may be formed in the front side bonding layer 50A. A backside bonding layer 50B may be formed on the backside of the semiconductor substrate 102. However, in some embodiments, the backside bonding layer 50B may be omitted, depending on the intended location of the die 100.

A backside bonding pad 52B may be formed in the backside bonding layer 50B. The front side bonding layer 50A and the backside bonding layer 50B may be formed by depositing a bonding material using any suitable deposition method. Suitable bonding materials may include silicon oxide or binding polymers as described above, or the like, such as an epoxy, a polyimide (PI), a benzocyclobutene (BCB), and a polybenzoxazole (PBO). Other suitable bonding materials configured for binding with a silicon substrate may be within the contemplated scope of disclosure. The front side die bonding pads 52A and the backside bonding pads 52B may be electrically conductive features formed of the same materials as the metal features 112. For example, the front side die bonding pads 52A and the backside bonding pads 52B may include tungsten (W), copper (Cu), a copper alloy, aluminum (Al), an aluminum alloy, or a combination thereof, or the like.

A dielectric encapsulation (DE) layer 40 may be formed on side surfaces of the die 100. The DE layer 40 may be formed of a dielectric material, such as silicon oxide, silicon nitride, a molding compound including a resin and a filler, or the like. The DE layer 40 may be formed by any suitable deposition process, such as spin-coating, lamination, deposition or the like.

The TSV structure 162 may be disposed in a trench formed in the semiconductor substrate 102. The TSV structure 162 may be electrically connected to the interconnect structure 110 and the backside bonding pad 52B. The TSV structure 162 may be formed of suitable electrically conductive material, such as, copper (Cu), a copper alloy, aluminum (Al), an aluminum alloy, silver (Ag), tungsten (W), combinations thereof, or the like. For example, the TSV structure 162 may preferably include copper at an atomic percentage greater than 80%, such as greater than 90% and/or greater than 95%, although greater or lesser percentages of copper may be used.

In some embodiments, a barrier layer may be disposed between the TSV structures 162 and the semiconductor substrate 102 and the dielectric structure 104. The barrier layer may include Ta, TaN, Ti, TiN, CoW, or combinations thereof, for example. Other suitable barrier layer materials may be within the contemplated scope of disclosure.

Semiconductor Package Thermal Interface Structures

Figure 2A:
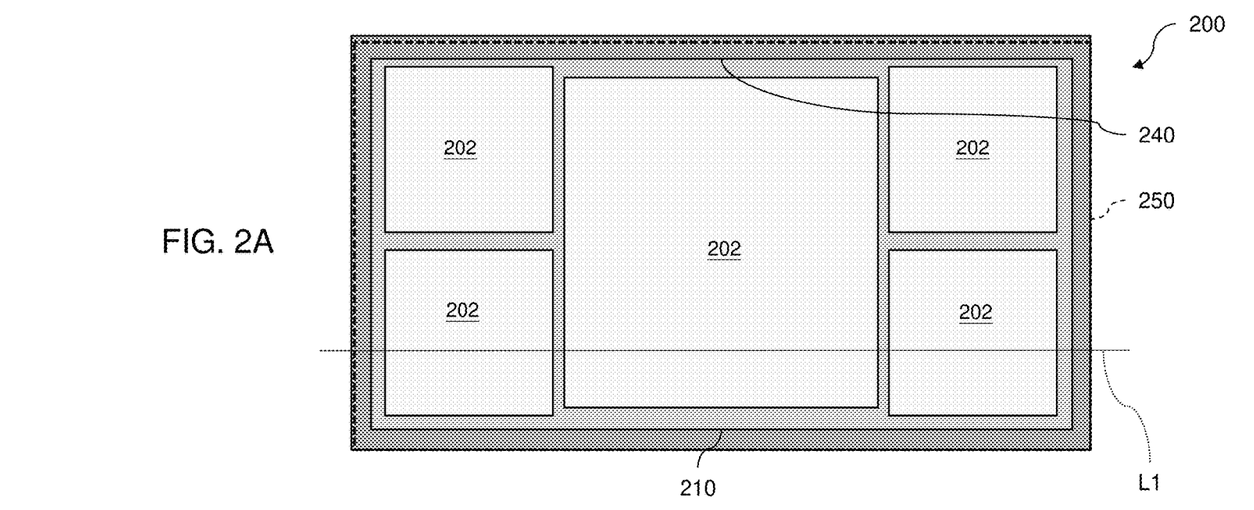
FIG. 2A is a simplified top view of a semiconductor package 200, according to various embodiments of the present disclosure.
Figure 2B:
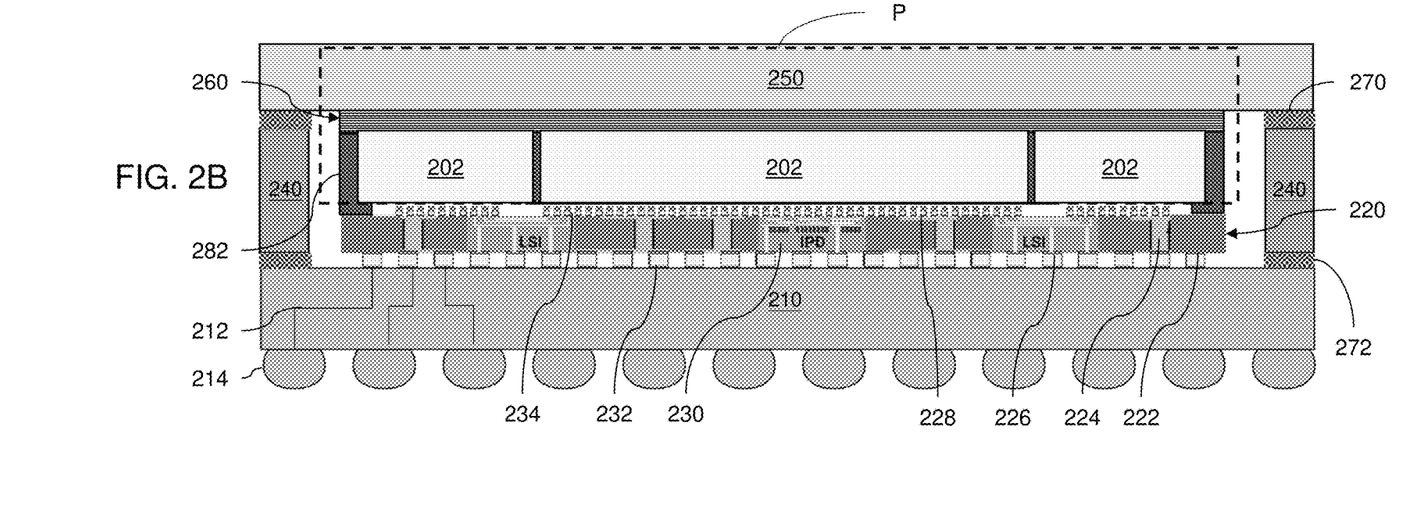
FIG. 2B is a vertical cross-sectional view taken along line L1 of FIG. 2A.
Figure 2C:
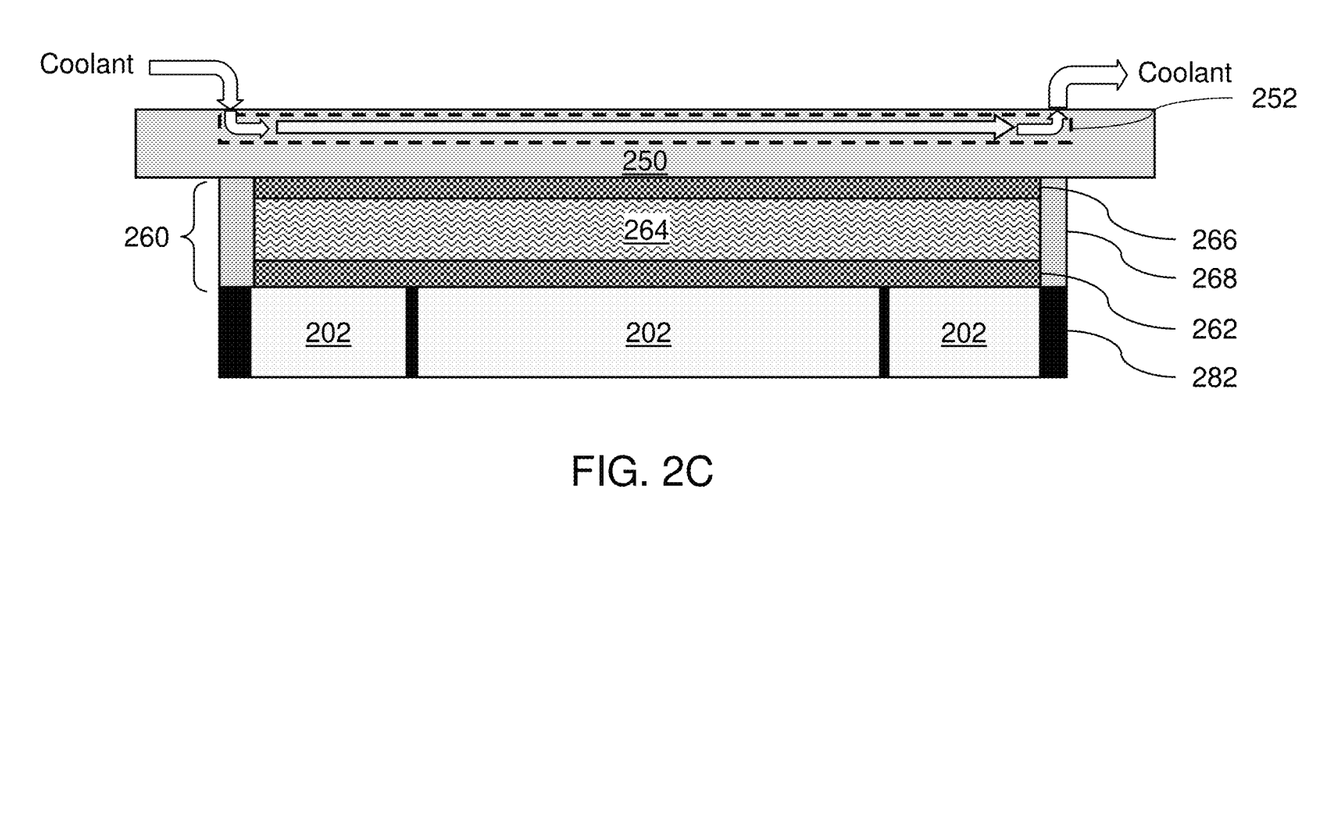
FIG. 2C shows an enlarged portion P of FIG. 2B.

FIG. 2A is a simplified top view of a semiconductor package 200, according to various embodiments of the present disclosure. FIG. 2B is a cross-sectional view taken along line L1 of FIG. 2A. FIG. 2C shows an enlarged portion P of FIG. 2B.

Referring to FIGS. 1, 2A, 2B, and 2C, the semiconductor package 200 may include a package substrate 210, an interposer 220 disposed on the package substrate 210, semiconductor devices 202 disposed on the interposer 220, a package ring 240 disposed on the perimeter of the package substrate 210, a cover 250 disposed on the package ring 240, covering the semiconductor devices 202, a cover adhesive 270, a substrate adhesive 272, and a metallic thermal interface structure (TIS) 260 disposed between the semiconductor devices 202 and the cover 250.

The package substrate 210 may be any suitable package substrate, such as a polymer substrate, organic resin substrate, a laminate substrate, a printed circuit board, or the like. Common laminate substrates include FR4 substrates and bismaleimide-triazine (BT) substrates. The package substrate 210 may include metal package traces 212 that are electrically connected to corresponding package balls 214 (e.g., solder balls).

In various embodiments, the semiconductor devices 202 may each include a semiconductor die 100, as shown in FIG. 1, or a stack of multiple interconnected semiconductor dies 100. The semiconductor devices 202 may be any suitable type of semiconductor device, depending on the intended function of the semiconductor package 200. For example, the semiconductor devices 202 may include system-on-chip (SoC) devices, flip chips (FC), three-dimensional integrated circuits (3DICs), wafer level packages (WLPs), package on package (PoP), system on integrated circuit (SoIC) devices, or the like. In some embodiments, the semiconductor devices 202 may include logic devices and memory devices, such as high bandwidth memory (HBM) devices, dynamic random-access memory (DRAM) devices, or the like.

The interposer 220 may be configured to electrically connect the semiconductor devices 202 to the package substrate 210. For example, the interposer 220 may be a silicon interposer, a redistribution layer (RDL) interposer, a chip-on-wafer-silicon (CoWoS®) interposer, or the like. CoWoS® interposers may include chip-on-wafer-silicon redistribution layer (CoWoS®-R) interposers and chip-on-wafer-silicon local silicon interconnect bridge (CoWoS®-L) interposers, for example. As shown in FIG. 2B, in some embodiments the interposer 220 may be a CoWoS®-L interposer including an organic molding material 222, through interconnect via (TIV) structures 224, local silicon interconnect (LSI) structures 226, redistribution layer (RDL) structures 228, and/or integrated passive devices (IPDs) 230. The TIV structures 224 may be electrically connected to the package traces 212 by metal bumps 232, such as copper bumps. The TIV structures 224 may also be electrically connected to the RDL structures 228, which may be electrically connected to the semiconductor devices 202 by micro bumps 234.

The package ring 240 may extend around the perimeter of the package substrate 210, so as to surround the interposer 220 and the semiconductor devices 202. The package ring 240 may be bonded to the cover 250 by the cover adhesive 270, and may be bonded to the package substrate 210 by the substrate adhesive 272. The cover adhesive 270 may also bond the semiconductor devices 202 to the cover 250. The package ring 240 may be formed of a first metal or metal alloy, such as stainless steel (e.g., SUS304 or SUS440), copper, titanium, or the like.

The cover 250 may comprise a material having a coefficient of thermal expansion (CTE) similar to the CTE of the semiconductor devices 202. For example, silicon, silicon oxide, silicon nitride, or a combination thereof, for example. In some embodiments, the cover 250 may preferably comprise silicon. The cover 250 may have a thickness ranging from 50 µm to 3500 µm, such as from 100 µm to 3000 µm, although greater or lesser thicknesses may be used.

With reference to FIG. 2C, in some embodiments, the cover 250 may include heat transfer structures 252 formed in a top surface of the cover 250. The heat transfer structures 252 may comprise channels, pillars, or the like, configured to increase the heat dissipation capability of the cover 250. For example, in some embodiments the heat transfer structures 252 may include coolant channels configured to receive a liquid coolant, such as water or the like.

The TIS 260 may directly contact a bottom surface of the cover 250. In particular, the TIS 260 may be configured to transfer heat from the semiconductor devices 202 to the cover 250. The TIS 260 may include one or more layers of high thermal conductivity material. For example, the TIS 260 may include a first solder layer 262, an interface layer 264, and an optional second solder layer 266. The TIS 260 may also include a spacer 268 disposed around the perimeters of the first solder layer 262, the interface layer 264, and the second solder layer 266. In various embodiments, the first solder layer 262, the interface layer 264, and/or the third solder layer 266 may be solid planar layers or films.

The first solder layer 262 and the second solder layer 266 may be formed of a solder material having a high thermal conductivity. For example, the solder material may include at least 50 weight percent (wt. %) gallium. In some embodiments, the solder material may be a gallium-based solder material comprising 62.5 wt. % gallium, 21.5 wt. % indium, and 16.0 wt. % tin, manufactured by Indium Corp.

The first solder layer 262 and/or the second solder layer 266 may be applied in layers and have a thickness ranging from 20 μm to 250 μm, such as from 30 μm to 200 μm, although greater or lesser thicknesses may be used.

The interface layer 264 may be formed of a material having a high thermal conductivity. In some embodiments, the interface layer 264 may comprise a metal foil, carbon nanotubes, a graphene composite, a silver paste material, a combination thereof, or other suitable materials having high thermal conductivity. For example, the interface layer 264 may comprise an indium foil.

The spacer 268 may be formed of a heat-resistant polymer material, such as a polymer tape or O-ring, for example. The spacer 268 may be configured to confine the first solder layer 262 and/or the second solder layer 266, when such layers are applied in a liquid or gel state.

In some embodiments, the TIS 260 and the cover 250 may be configured such that the semiconductor package 100 has a thermal design power (TDP) of at least 2000 watts (W), when direct liquid cooling is used to cool the cover 250. The TIS 260 may have a thermal resistance ($R_{th}$) of (5° C.*mm$^2$)/W or less, such as an $R_{th}$ of (4° C.*mm$^2$)/W or less.

Figure 3:
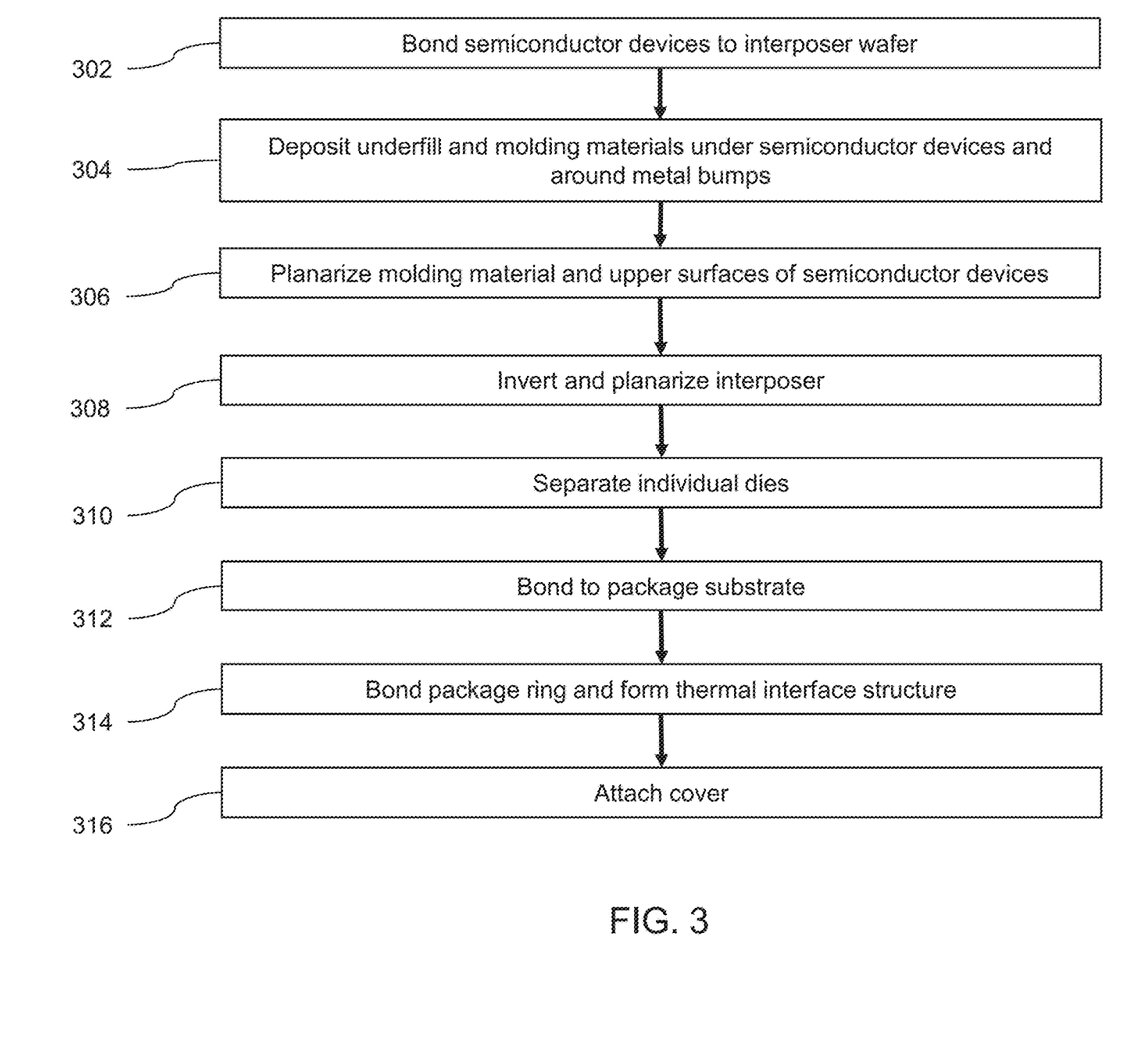
FIG. 3 is a flow diagram showing operations of a method of forming a semiconductor package, according to various embodiments of the present disclosure.

FIG. 3 is a flow diagram showing the operations of a method of forming a semiconductor package 200, according to various embodiments of the present disclosure. FIGS. 4A-4H are cross-sectional views illustrating the operations of FIG. 3. Referring to FIGS. 3 and 4A-4H, in operation 302 semiconductor devices 202 may be bonded to an interposer wafer 220W. In particular, the semiconductor devices 202 may be electrically connected to TIV structures 224 formed in the interposer wafer 220W by micro bumps 234 and RDL structures 228.

Figure 4A:
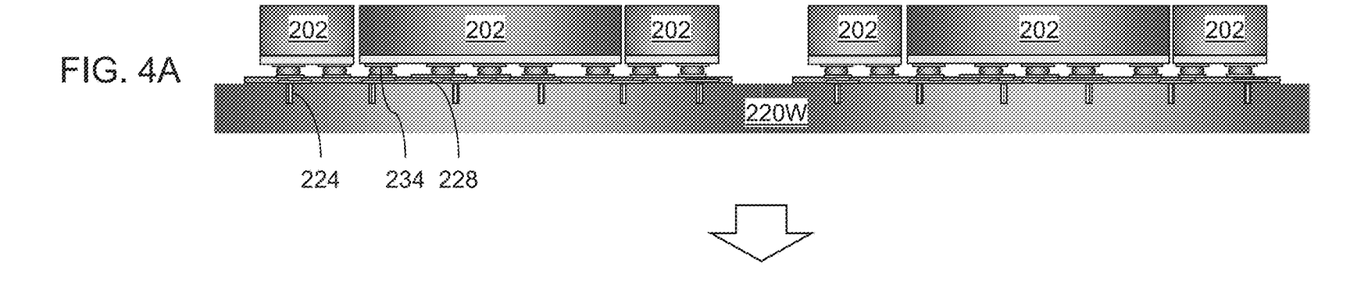
FIGS. 4A-4H are vertical cross-sectional views illustrating operations of the method of FIG. 3.
Figure 4B:
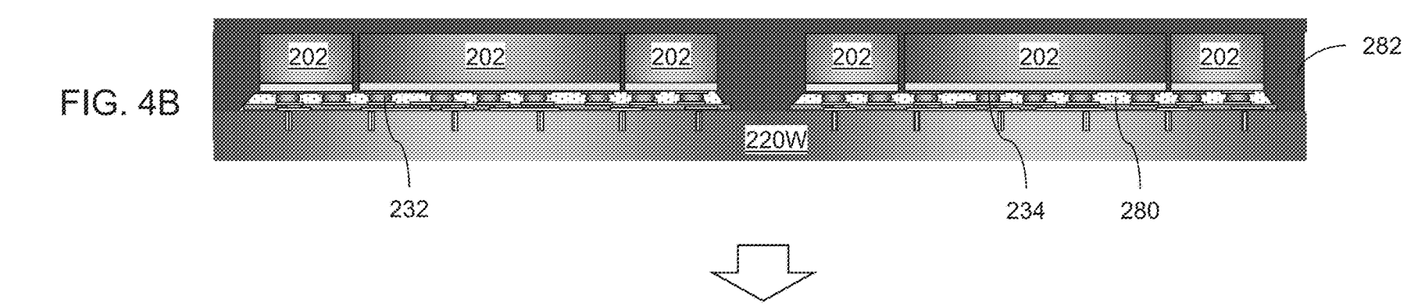

In operation 304, an underfill material 280 may be injected under the semiconductor devices 202 and around the metal bumps 232. The underfill material 280 may be applied as a liquid and then may be prebaked and/or cured. A molding material 282 may then be applied to the interposer wafer 220W, so as to surround the semiconductor devices 202. The molding material 282 may be applied as a liquid and then may be prebaked and/or compression molded.

Figure 4C:
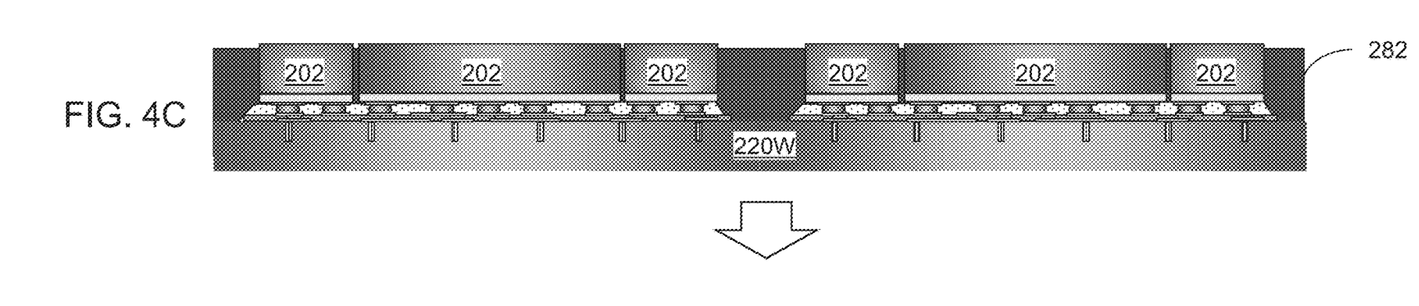

In operation 306, a planarization process, such as a chemical-mechanical planarization (CMP) process may be performed to planarize the molding material 282 and/or upper surfaces of the semiconductor devices 202. In particular, the CMP process may include recessing the molding material 282, such that upper surfaces of the semiconductor devices 202 are exposed from the molding material 282.

Figure 4D:
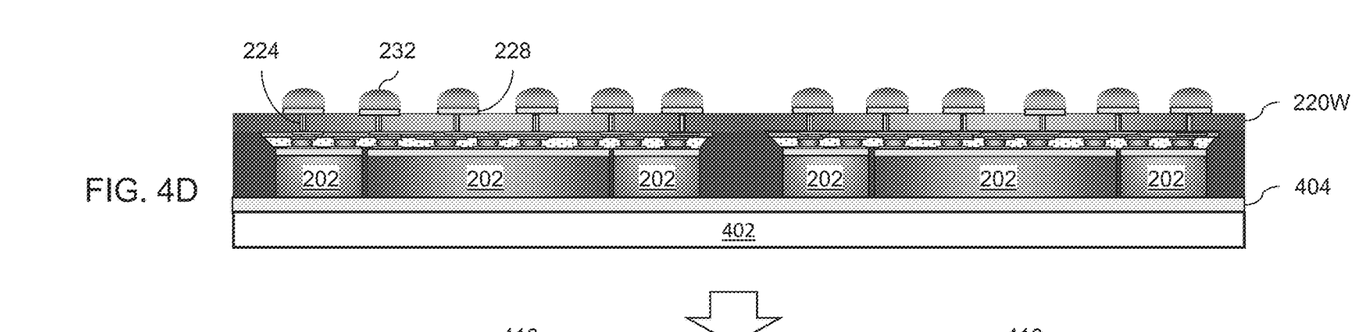

In operation 308, the structure formed in operation 306 may be inverted and bonded to a carrier wafer 402 by a wafer bonding layer 404. The interposer wafer 220W may be thinned, for example using a grinding process, to expose the TIV structures 224 on a backside of interposer wafer 220W. The backside of the interposer wafer 220W may then be planarized using a CMP process, for example. Micro bumps 234 and contact pads may then be formed on the backside of the interposer wafer 220W, in electrical contact with respective TIV structures 224.

Figures 4E, 4F:
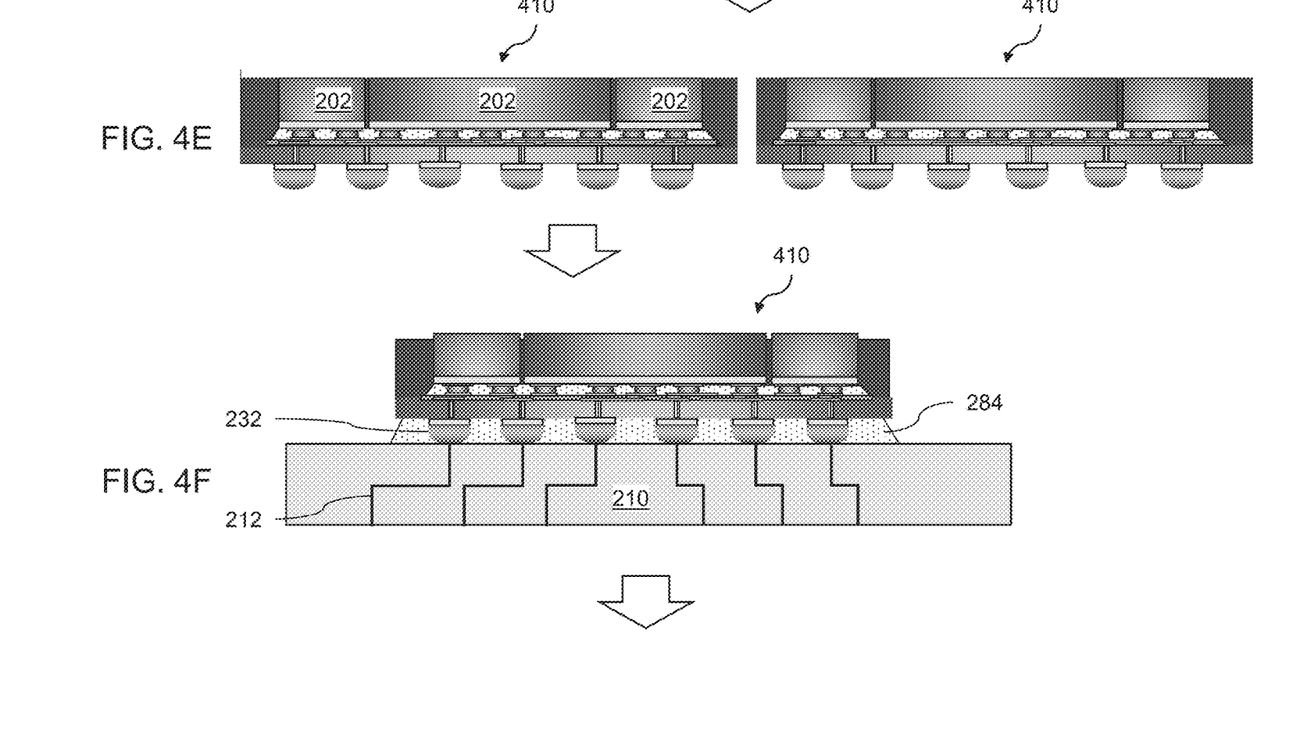

In operation 310, the structure formed in operation 308 may be cut into individual dies 410, using any suitable cutting process. The dies 410 may then be removed from the carrier wafer 402 and inverted.

In operation 312, each die 410 may be bonded to a package substrate 210. In particular, the metal bumps 232 may be electrically connected to package traces 212 of the package substrate 210. An underfill material 284 may be injected under the semiconductor devices 202 and around the metal bumps 232. The underfill material 284 may be injected as a liquid and then prebaked and/or cured.

Figure 4G:
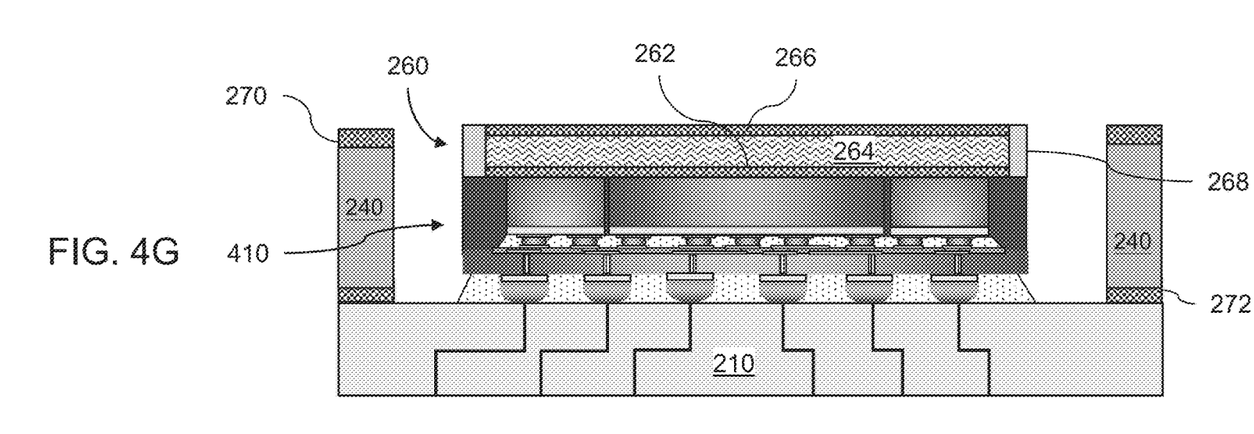

In operation 314, a package ring 240 may be attached to the package substrate 210 by a substrate adhesive 272. The substrate adhesive 272 may then be cured, for example, using heat or UV light. A TIS 260 may be formed on the die 410, and a cover adhesive 270 may be formed on the package ring 240. In particular, the TIS 260 may be formed by disposing a spacer 268 around the perimeter to the die 410. A first solder layer 262 may be formed inside the spacer 268 and on the semiconductor devices 202. For example, the first solder layer 262 may be formed by depositing a liquid solder material on the semiconductor devices 202.

An interface layer 264 may then be positioned on the first solder layer 262. In some embodiments, the interface layer 264 may be disposed on the first solder layer 262 before the first solder layer 262 is completely solidified, in order to bond the interface layer 264 and the first solder layer 262. In some embodiments, an optional second solder layer 266 may be formed on the interface layer 264.

Figure 4H:
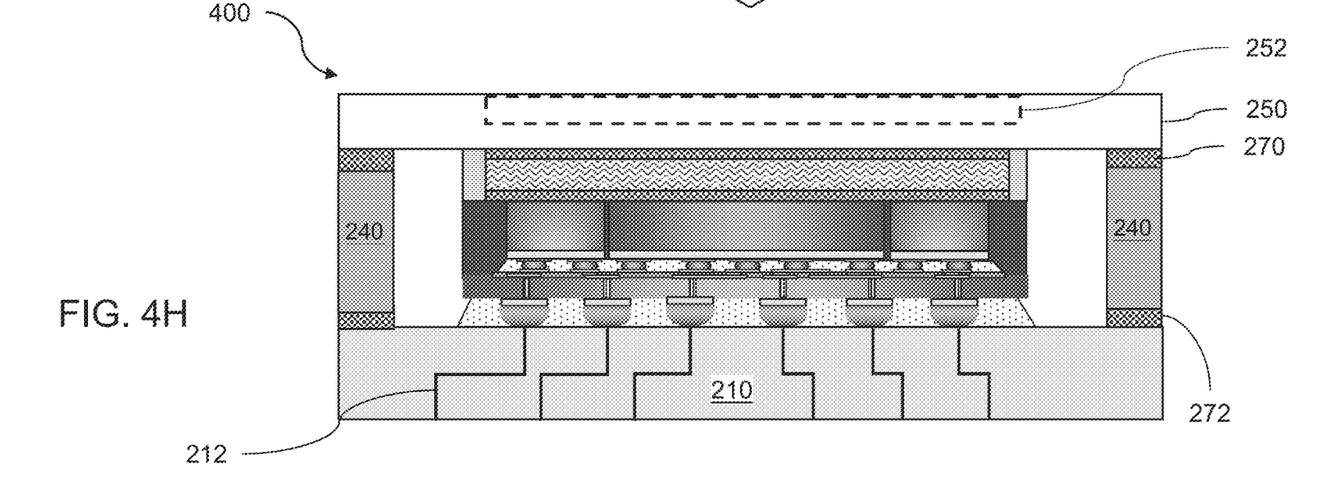

In operation 316, a cover 250 may be disposed on the package ring 240 and the TIS 260. For example, the cover 250 may be disposed on cover adhesive 270, and the cover adhesive 270 may then be cured to complete the semiconductor package 400. The cover 250 may optionally be bonded to the TIS 260 by the optional second solder layer 266.

The cover 250 may include heat transfer structures 252. In some embodiments, the heat transfer structures 252 may be formed on a top surface of the cover 250, using any suitable method, such as machining laser cutting, etching, milling, or the like. The heat transfer structures 252 may be formed before or after attaching the cover 250 to the package ring 240.

In operation 316, a cover 250 may be disposed on the package ring 240 and the TIS 260 to form a semiconductor package 200. For example, the cover 250 may be bonded to the package ring 240 by the cover adhesive 270. The cover 250 may optionally be bonded to the TIS 260 by the second solder layer 266.

Various embodiments provide a semiconductor package 200 that may include: a package substrate 210; semiconductor devices 202 disposed over the package substrate 210; a package ring 240 disposed on a perimeter of package substrate 210 surrounding the semiconductor devices 202; a cover 250 comprising silicon bonded to the package ring 240 and covering the semiconductor devices 202; and a thermal interface structure (TIS) 260 thermally connecting the semiconductor devices 202 to the cover 250.

Various embodiments provide a semiconductor package 200 that may include: a package substrate 210; semiconductor devices 202 disposed over the package substrate 210; a package ring 240 disposed on a perimeter of package substrate 210 surrounding the semiconductor devices 202; a cover 250 comprising silicon bonded to the package ring 240 and covering the semiconductor devices 202; and a thermal interface structure (TIS) 260 thermally connecting the semiconductor devices 202 to the cover 250.

In one embodiment, the TIS 260 may include: a first solder layer 262 bonded to the semiconductor devices 202 and may include germanium; and an interface layer 264 disposed on the first solder layer 262. In one embodiment, the first solder layer 262 may include germanium, indium, and tin. In one embodiment, the TIS further may include a second solder layer 266 disposed between the interface layer 264 and the cover 250. In one embodiment, the second solder layer 266 may include germanium, indium, and tin. In one embodiment, the interface layer 264 may include an indium foil. In one embodiment, the interface layer 264 may include one of carbon nanotubes, a graphene composite, a silver paste, or a combination thereof. In one embodiment, the TIS may further include a spacer 240 extending around the first solder layer 262 and the interface layer 264. In one embodiment, the TIS has a thermal resistance ($R_{th}$) of ($5°$ C.*$mm^2$)/W or less. In one embodiment, the package 200 has a thermal design power of at least 2000 Watts. In one embodiment, the cover 250 may include heat transfer structures 252 configured to increase a heat dissipation capability of the cover. In an embodiment, the heat transfer structures 252 may include coolant channels configured to receive a liquid coolant. In one embodiment, the semiconductor devices 202 may include at least one of system-on-chip (SoC) devices, flip chips (FC), three-dimensional integrated circuits (3DICs), wafer level packages (WLPs), package-on-package (PoP) devices, system on integrated circuit (SoIC) devices, or a combination thereof.

Other embodiments may provide a semiconductor package 200 that may include: a package substrate 210; semiconductor devices 202 disposed over the package substrate 210; a package ring 240 disposed on a perimeter of the package substrate 210, surrounding the semiconductor devices 202; a cover 250 comprising silicon bonded to the package ring 240 and covering the semiconductor devices 202; and a thermal interface structure (TIS) 260 thermally connecting the semiconductor devices 202 to the cover 250 and having a thermal resistance ($R_{th}$) of ($5°$ C.*$mm^2$)/W or less, wherein the TIS 260 may include: a first solder layer 262 bonded to the semiconductor devices and including germanium; and an interface layer 264 disposed on the first solder layer 262.

In one embodiment, the first solder layer 262 includes germanium, indium, and tin; and the interface layer 264 includes one of an indium foil, carbon nanotubes, a graphene composite, a silver paste, or a combination thereof. In one embodiment, the TIS 260 further includes a spacer 268 surrounding the first solder layer 262 and the interface layer 264. In one embodiment, the TIS 260 further includes a second solder layer 266 disposed between the interface layer 264 and the cover 250. In one embodiment, the cover may include coolant channels 252 configured to receive a liquid coolant; and the semiconductor package 200 has a thermal design power of at least 2000 Watts.

In some embodiments, the TIS 260 further comprises a second solder layer 266 disposed between the interface layer 264 and the cover 250. In some embodiments, the first solder layer 262 and/or the second solder layer 266 may comprise germanium, indium, and tin. In some embodiments, the interface layer 264 comprises an indium foil, carbon nanotubes, a graphene composite, a silver paste, or a combination thereof. In some embodiments, the TIS has a thermal resistance ($R_{th}$) of ($5°$ C.*$mm^2$)/W or less, and the semiconductor package 200 has a thermal design power of at least 2000 Watts. In some embodiments, the cover 250 comprises heat transfer structures 252 configured to increase a heat dissipation capability of the cover 250, and the heat transfer structures 252 may include coolant channels configured to receive a liquid coolant.

Various embodiments further provide a method of manufacturing a semiconductor package 400, bonding a die 410 comprising semiconductor devices 202 and an interposer 220 electrically connected to the semiconductor devices 202, to a package substrate 210; bonding a package ring 240 to a perimeter of the package substrate 210; forming a thermal interface structure (TIS) 260 on an upper surface of the die 410; and bonding a cover 250 comprising silicon to the package ring 240, such that the TIS 260 thermally connects the semiconductor devices 202 to the cover 250. The TIS 260 may be formed by: bonding a spacer 268 to the upper surface of the die 410; forming a first solder layer 262 comprising germanium inside of the spacer 268; and attaching an interface layer 264 to the first solder layer 262.

With reference to FIGS. 1-4H, a method of manufacturing a semiconductor package 200 may be provided in which the method may include: bonding a die 100 comprising semiconductor devices 202 and an interposer 220 electrically connected to the semiconductor devices 202, to a package substrate 210; bonding a package ring 240 to a perimeter of the package substrate 210; forming a thermal interface structure (TIS) 260 on an upper surface of the die 100 by: bonding a spacer 268 to the upper surface of the die 100; forming a first solder layer 262 including germanium inside of the spacer 268; and attaching an interface layer 264 to the first solder layer 262; and bonding a cover 250 that may include silicon to the package ring 240, such that the TIS 260 thermally connects the semiconductor devices 202 to the cover 250.

In one embodiment, the forming a TIS 260 may further include forming a second solder layer 266 that may include germanium on the interface layer 264; the interface layer 264 may include an indium foil; the cover 250 may include coolant channels 252 configured to receive a liquid coolant; and the TIS 260 may have a thermal resistance ($R_{th}$) of ($5°$ C.*$mm^2$)/W or less.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
    a package substrate;
    semiconductor devices disposed over the package substrate;
    a package ring disposed on a perimeter of the package substrate, surrounding the semiconductor devices;
    a cover comprising silicon bonded to the package ring and covering the semiconductor devices; and
    a thermal interface structure (TIS) thermally connecting the semiconductor devices to the cover, the TIS comprising:

a first solder layer bonded to the semiconductor devices and comprising germanium; and an interface layer disposed on the first solder layer.

2. The semiconductor package of claim 1, wherein the first solder layer comprises one of germanium, indium, or tin.

3. The semiconductor package of claim 1, wherein the TIS further comprises a second solder layer disposed between the interface layer and the cover.

4. The semiconductor package of claim 3, wherein the second solder layer comprises one of germanium, indium, or tin.

5. The semiconductor package of claim 1, wherein the interface layer comprises an indium foil.

6. The semiconductor package of claim 1, wherein the interface layer comprises one of carbon nanotubes, a graphene composite, a silver paste, or a combination thereof.

7. The semiconductor package of claim 1, wherein the TIS further comprises a spacer extending around the first solder layer and the interface layer.

8. The semiconductor package of claim 1, wherein the TIS has a thermal resistance ($R_{th}$) of (5° C.*mm$^2$)/W or less.

9. The semiconductor package of claim 1, wherein the package has a thermal design power of at least 2000 Watts.

10. The semiconductor package of claim 1, wherein the cover comprises heat transfer structures configured to increase a heat dissipation capability of the cover.

11. The semiconductor package of claim 10, wherein the heat transfer structures comprise coolant channels configured to receive a liquid coolant.

12. The semiconductor package of claim 1, wherein the semiconductor devices comprise at least one of system-on-chip (SoC) devices, flip chips (FC), three-dimensional integrated circuits (3DICs), wafer level packages (WLPs), package-on-package (PoP) devices, system on integrated circuit (SoIC) devices, or a combination thereof.

13. A semiconductor package comprising:
a package substrate;
semiconductor devices disposed over the package substrate;
a package ring disposed on a perimeter of the package substrate, surrounding the semiconductor devices;
a cover comprising silicon bonded to the package ring and covering the semiconductor devices; and
a thermal interface structure (TIS) thermally connecting the semiconductor devices to the cover and having a thermal resistance ($R_{th}$) of (5° C.*mm$^2$)/W or less,
wherein the TIS comprises:
a first solder layer bonded to the semiconductor devices and comprising germanium; and
an interface layer disposed on the first solder layer.

14. The semiconductor package of claim 13, wherein:
the first solder layer comprises one of germanium, indium, and tin; and
the interface layer comprises one of an indium foil, carbon nanotubes, a graphene composite, a silver paste, or a combination thereof.

15. The semiconductor package of claim 13, wherein the TIS further comprises a spacer surrounding the first solder layer and the interface layer.

16. The semiconductor package of claim 15, wherein the TIS further comprises a second solder layer disposed between the interface layer and the cover.

17. The semiconductor package of claim 15, wherein:
the cover comprises coolant channels configured to receive a liquid coolant; and
the semiconductor package has a thermal design power of at least 2000 Watts.

18. A method of manufacturing a semiconductor package, comprising:
bonding a die comprising semiconductor devices and an interposer electrically connected to the semiconductor devices, to a package substrate;
bonding a package ring to a perimeter of the package substrate;
forming a thermal interface structure (TIS) on an upper surface of the die by:
bonding a spacer to the upper surface of the die;
forming a first solder layer comprising germanium inside of the spacer; and
attaching an interface layer to the first solder layer; and
bonding a cover comprising silicon to the package ring, such that the TIS thermally connects the semiconductor devices to the cover.

19. The method of claim 18, wherein:
the forming of the TIS further comprises forming a second solder layer comprising germanium on the interface layer;
the interface layer comprises an indium foil;
the cover comprises coolant channels configured to receive a liquid coolant; and
the TIS has a thermal resistance ($R_{th}$) of (5° C.*mm$^2$)/W or less.

20. The method of claim 18, wherein the interface layer comprises one of carbon nanotubes, a graphene composite, a silver paste, or a combination thereof.

* * * * *